United States Patent [19]

Koleske et al.

[11] Patent Number: 4,812,488

[45] Date of Patent: * Mar. 14, 1989

[54] PHOTOCOPOLYMERIZABLE COMPOSITIONS BASED ON HYDROXYL-CONTAINING ORGANIC MATERIALS AND SUBSTITUTED CYCLOALIPHATIC MONOEPOXIDE REACTIVE DILUENTS

[75] Inventors: Joseph V. Koleske, Charleston, W. Va.; George T. Kwiatkowski, Green Brook, N.J.

[73] Assignee: Union Carbide Corporation, Danbury, Conn.

[*] Notice: The portion of the term of this patent subsequent to Nov. 11, 2003 has been disclaimed.

[21] Appl. No.: 794,604

[22] Filed: Nov. 6, 1985

Related U.S. Application Data

[63] Continuation of Ser. No. 464,568, Feb. 7, 1983, abandoned.

[51] Int. Cl.[4] .................... C08G 65/14; C08G 65/28
[52] U.S. Cl. ........................ 522/31; 522/77; 522/170; 528/354; 528/356; 528/393
[58] Field of Search .............. 522/170, 31; 528/354, 528/356

[56] References Cited

U.S. PATENT DOCUMENTS

| | | | |
|---|---|---|---|
| 3,247,285 | 4/1966 | Belanger | 528/419 |
| 3,936,557 | 2/1976 | Watt | 428/211 |
| 3,998,771 | 12/1976 | Feneis et al. | 523/442 |
| 4,026,705 | 5/1977 | Crivello | 522/15 |
| 4,173,476 | 11/1979 | Smith et al. | 430/280 |
| 4,184,004 | 1/1980 | Pines et al. | 428/480 |
| 4,218,531 | 8/1980 | Carlson | 430/280 |
| 4,231,951 | 11/1980 | Smith et al. | 260/446 |
| 4,256,828 | 3/1981 | Smith | 430/280 |
| 4,622,349 | 11/1986 | Koleske et al. | 522/31 |

FOREIGN PATENT DOCUMENTS 916246 1/1963 United Kingdom .

OTHER PUBLICATIONS

Kosar "Light-Sensitive Systems", 1965 John Wiley & Sons. p. 170.
Copending U.S. patent application Ser. No. 369,835, filed Apr. 19, 1982 entitled "Photocopolymerizable Compositions Based on Epoxy and Hydroxyl-Containing Organic Materials", Joseph Victor Koleske.

Primary Examiner—Wilbert J. Briggs, Sr.
Assistant Examiner—Arthur H. Koeckert
Attorney, Agent, or Firm—Jean B. Mauro

[57] ABSTRACT

This invention is directed to photocopolymerizable compositions comprising a poly (active hydrogen) organic compound, a photoinitiator and, as a reactive diluent, a substituted cycloaliphatic monoepoxide. The photocopolymerizable compositions have low viscosity and can be applied to suitable substrates by conventional methods and, after curing, provide excellent pressure sensitive and heat-activated adhesive coatings.

9 Claims, No Drawings ated in the cationic catalyst composition is formed that cures the formulation into a coating film with little or no organic volatiles escaping into the atmosphere.

PHOTOCOPOLYMERIZABLE COMPOSITIONS BASED ON HYDROXYL-CONTAINING ORGANIC MATERIALS AND SUBSTITUTED CYCLOALIPHATIC MONOEPOXIDE REACTIVE DILUENTS

This application is a continuation of U.S. application Ser. No. 464,568, filed Feb. 7, 1983, now abandoned.

BRIEF SUMMARY OF THE INVENTION

1. Technical Field

This invention is directed in general to pressure sensitive and heat-activated adhesive coating compositions and, in particular, to photocopolymerizable compositions comprising a poly(active hydrogen) organic compound, a photoinitiator and, as a reactive diluent, a substituted cycloaliphatic monoepoxide.

2. Background Art

Governmental regulations have placed ever increasing restrictions on the amounts and types of organic volatiles permitted to escape into the atmosphere from coatings compositions. Considerable efforts have been expended to develop coatings compositions having a minimal amount of volatile organic components and this has led to development of radiation curable coatings, powder coatings, water borne coatings and high solids coatings. In these recent developments the amounts of organic solvents present are minimal and consequently there is little or no atmospheric pollution.

In the field of radiation curable coatings, it is well known that coating compositions containing cycloaliphatic expoxides and hydroxyl-containing materials can be radiation cured by the use of onium salts such as FC-508 available from the 3M Company and UVE-1014 available from General Electric Company. The onium salts form shelf-stable formulations with cycloaliphatic epoxides and hydroxyl-containing materials in an environment free of ultraviolet light radiation. When such onium salts are irradiated with ultraviolet light, a cationic catalyst composition is formed that cures the formulation into a coating film with little or no organic volatiles escaping into the atmosphere.

However, the cycloaliphatic epoxides used in the radiation curable coatings have a relatively high viscosity of about 300 to 500 centipoise or more. In addition, hydroxyl-containing materials such as organic polyols are oftentimes blended with the cycloaliphatic epoxide to improve certain coating properties such as flexibility and toughness of the coating. When the organic polyols are of sufficient molecular weight to improve flexiblity of the cured coatings, the viscosity of the blended formulations is oftentimes increased even further. The high viscosity of the blended formulations precludes the application thereof to a suitable substrate by conventional techniques such as roll coating, spray and other methods of application. Solvents in general can be used to reduce the viscosity of the curable blended formulations. However, the solvents must be volatilized at some point in the curing process and such volatilization will negate the atmospheric pollution control benefits of radiation curable coatings which are considered to be essentially 100 percent solids coating systems. Thus, radiation curable coatings such as the ones hereinafter described which exhibit desirably low viscosity and produce good satisfactory cured coating films, are of great importance.

It has been found as a result of the present invention that certain substituted cycloaliphatic monoepoxides can be used as reactive diluents in photocopolymerizable coating compositions based on hydroxyl-containing organic materials to produce curable coating formulations having desirable low viscosity. Such curable coating formulations require little or no organic solvent to improve flowability during application thereof by conventional methods to a suitable surface or substrate. The cured coating films prepared from these low viscosity photocopolymerizable coating formulations also exhibit highly desirable adhesive film properties as described more fully hereinbelow.

DISCLOSURE OF THE INVENTION

The present invention is directed to photocopolymerizable compositions comprising a poly(active hydrogen) organic compound, a photoinitiator and, as a reactive diluent, a substituted cycloaliphatic monoepoxide. The invention is also directed to blend compositions comprising a poly(active hydrogen) organic compound and a vinyl cycloaliphatic monoepoxide. The above compositions can optionally contain a surfactant, filler, additives and an organic solvent where necessary. The photocopolymerizable compositions have desirably low viscosity and can be applied in a conventional manner such as roll coating, spray and the like and, after exposure to any source of radiation emitting actinic radiation at a wavelength within the ultraviolet and visible spectral regions, can be cured to pressure sensitive and heat-activated adhesive coating films. The cured adhesive coating films have general utility in most adhesive applications. The photocopolymerizable compositions can also be used in a variety of applications in the field of graphic arts including printing inks and the like.

The invention is further directed to process for preparing a cured film coating comprising: (i) mixing until homogeneous a photocopolymerizable composition comprising a poly(active hydrogen) organic compound, a substituted cycloaliphatic monoepoxide and a photoinitiator; (2) applying the homogeneous photocopolymerizable composition as a film coating on a suitable surface or substrate; and (3) exposing the film coating to actinic irradiation at a wavelength within the ultra violet and visible spectral regions or electron beam irradiation for a period of time sufficient to cure the film coating. The cured film coating prepared by the above described process is also a part of this invention. The cured adhesive film coating is yet another part of this invention.

In copending U.S. patent application Ser. No. 464,571, filed on 02/07/83, now abandoned, there is described photocopolymerizable compositions comprising an epoxide containing two or more epoxy groups, a poly (active hydrogen) organic compound, a photoinitiator, and, as a reactive diluent, a substituted cycloaliphatic monoepoxide. The photocopolymerizable compositions have desirably low viscosity and can be applied in a conventional manner such as roll coating, spray and the like and, after being cured to dry coating films, can have utility as automotive finishes, can finishes, appliance finishes, general metal finishes, adhesives, printing inks and the like.

Copending U.S. patent application Ser. No. 464,570, filed on an even date herewith, now abandoned, describes photocopolymerizable compositions comprising a photoinitiator selected from diazonium salts, onium salts and mixtures thereof and, as a reactive diluent, a cycloaliphatic epoxide. The photocopolymerizable compositions have desirably low viscosity and can be applied to suitable substrates by conventional methods.

In copending U.S. patent application Ser. No. 464,563, filed on 02/07/83, now U.S. Pat. No. 4,593,051, there is described photocopolymerizable compositions comprising an epoxide containing two or more epoxy groups, a polymer/poly (active hydrogen) organic compound and a photoinitiator. The cured coating compositions exhibit a clear appearance, good water resistance and can have utility as automotive finishes, appliance finishes, general metal finishing and the like.

Copending U.S. patent application Ser. No. 464,580, filed on an even data herewith, now abandoned, describes photocopolymerizable compositions comprising an epoxide containing two or more epoxy groups, a poly (active hydrogen) organic compound having at least some primary hydroxyl content and a photoinitiator. The cured coating compositions exhibit fast cure rates, good water resistance and can have utility as automotive finishes, appliance finishes, general metal finishing and the like.

In copending U.S. patent application Ser. No. 464,564, filed on an even data herewith, now abandoned, there is described photocopolymerizable compositions comprising an epoxide containing two or more epoxy groups, a photoinitiator and, as a reactive diluent, a substituted cycoaliphatic monoepoxide. The photocopolymerizable compositions have desirably low viscosity and can be applied to a suitable substrate in a conventional manner such as roll coating, spray and the like. The cured coatings are suitable for use in a variety of applications in the fields of protection coatings and graphic arts.

Copending U.S. patent application Ser. No. 464,558, filed on 02/07/83, now U.S. Pat. No. 4,622,349, describes photocopolymerizable compositions comprising an epoxide containing two or more epoxy groups, a poly (active hydrogen) organic compound and a hydroxyl substituted cycloaliphatic monoepoxide. The photocopolymerizable compositions can be cured into coatings which have improved water resistance.

DETAILED DESCRIPTION

The substituted cycloaliphatic monoepoxide useful in the coating compositions of this invention is substituted with alkyl of 1 to 9 carbon atoms, halogen, oxygen, ether, ester or vinyl radicals. Preferably, the substituted cycloalphatic monoepoxide is vinyl substituted cycloaliphatic monoepoxide and is preferably selected from one or more of the following:

(1) 4-vinyl cyclohexene monoepoxide having the formula:

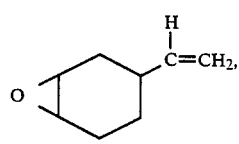

(2) norbornene monoepoxide having the formula:

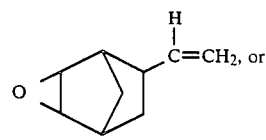

(3) limonene monoepoxide having the formula:

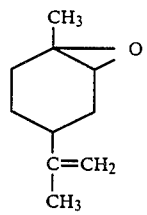

The substituted cycloaliphatic monoepoxide acts as a reactive diluent that cures into the final coating product, has a marked effect in lowering viscosity, is not volatilized during the radiation cure operation and does not retard the curing rate. The substituted cycloaliphatic monoepoxide is used in the photocopolymerizable and blend compositions in amounts of from about 0.1 to about 95, preferably from about 1 to about 60, and most preferably, from about 3 to about 30 weight percent.

The poly(active hydrogen) organic compound that is blended with the substituted cycloaliphatic monoepoxide to produce the adhesive coating compositions of this invention include any compatible organic compound containing two or more active hydrogen atoms per molecule. The poly(active hydrogen) organic compounds are well known the those skilled in the art and include, for example, organic polyols and the like. Substantially any of the organic polyols previously used in the art to make coating compositions can be used and are preferred as the poly(active hydrogen) organic compounds in this invention. Illustrative of the polyols useful in producing adhesive coating compositions in accordance with this invention are the polyether polyols such as polyhydroxyalkanes, and polyoxyalkylene polyols, the acrylic and vinyl polyols, the polyester polyols, the polycaprolactone polyols, the polymer/polyols, or the like. Among the polyether polyols which can be employed are those selected from one or more of the following classes of compositions, alone or in admixture, known to those skilled in the art:

(a) Alkylene oxide adducts of polyhydroxyalkanes;

(b) Alkylene oxide adducts of non-reducing sugars and sugar derivatives;

(c) Alkylene oxide adducts of phosphorus and polyphosphorus acids;

(d) Alkylene oxide adducts of polyphenols;

(e) The polyols from natural oils such as castor oil, and the like.

Illustrative alkylene oxide adducts of polyhydroxyalkanes include, among others, the alkylene oxide adducts of ethylene glycol, propylene glycol, 1,3-dihydroxypropane, 1,3-dihydroxybutane, 1,4-dihydroxybutane, 1,4-, 1,5-, and 1,6-dihydroxyhexane, 1,2-, 1,3-, 1,4-, 1,6-, and 1,8-dihydroxyoctane, 1,10-dihydroxydecane, glycerol, 1,2,4-trihydroxybutane, 1,2,6-trihydroxyhexane, 1,1,1-trimethylolethane, 1,1,1-trimethylolpropane, pentaerythritol, polycaprolactone, xylitol, arabitol, sorbitol, mannitol, and the like. A preferred class of alkylene oxide adducts of polyhydroxyalkanes are the ethylene oxide, propylene oxide, butylene oxide, or mixtures thereof, adducts of trihydroxyalkanes.

A further class of polyether polyols which can be employed are the alkylene oxide adducts of the non-reducing sugars, wherein the alkylene oxides have from 2 to 4 carbon atoms. Among the non-reducing sugars and sugar derivatives contemplated are sucrose, alkyl glycosides such as methyl glucoside, ethyl glucoside, and the like, glycol glycosides such as ethylene glycol glucoside, propylene glycol glucoside, glycerol glucoside, 1,2,6-hexanetriol glucoside, and the like, as well as the alkylene oxide adducts of the alkyl glycosides as set forth in U.S. Pat. No. 3,073,788.

The alkylene oxide adducts of phosphorus and polyphosphorus acids are another useful class of polyether polyols. Ethylene oxide, 1,2-epoxypropane, the epoxybutanes, 3,-chloro-1,2-epoxypropane, and the like are preferred alkylene oxides. Phosphoric acid, phosphorus acid, the polyphosphoric acids such as tripolyphosphoric acid, the polymetaphosphoric acids, and the like are desirable for use in this connection.

A still further useful class of polyether polyols is the polyphenols, and preferably the alkylene oxide adducts thereof wherein the the alkylene oxides have from 2 to 4 carbon atoms. Among the polyphenols which are contemplated are, for example, bisphenol A, bisphenol F, condensation products of phenol and formaldehyde, the novolac resins, condensation products of various phenolic compounds and acrolein; the simplest member of this class being the 1,1,3-tris(hydroxyphenyl) propanes, condensation products of various phenolic compounds and glyoxal, glutaraldehyde, and other dialdehydes, the simplest members of this class being the 1,1,2,2,-tetrakis(hydroxyphenol) ethanes, and the like.

The polyether polyols described hereinabove can have hydroxyl numbers which vary over a wide range. In general, the hydroxyl numbers of the above described polyols employed in this invention can range from about 15, and lower, to about 900, and higher. The hydroxyl number is defined as the number of milligrams of potassium hydroxide required for the complete neutralization of the fully phthalated derivative prepared from 1 gram of polyol. The hydroxyl number can also be defined by the equation:

$$OH = \frac{56.1 \times 1000 \times f}{m.w.}$$

where
OH=hydroxyl number of the polyol;
f=functionality, that is, average number of hydroxyl groups per molecule of polyol; and
m.w=molecular weight of the polyol.

The polyether polyols described hereinabove can be prepared by conventional methods and are commercially available from a number of manufacturers.

The polycaprolactone polyols, alone or in admixture, that can be used to prepare the coating compositions of this invention include any of the known polycaprolactone polyols that are commercially available and that are fully described, for example, in U.S. Pat. No. 3,169,945. As described in this patent the polycaprolactone polyols are produced by the catalytic polymerization of an excess of a caprolactone and an organic polyfunctional initiator having as least two reactive hydrogen atoms. The organic functional initiators can be any polyhydroxyl compound as is shown in U.S. Pat. No. 3,169,945. Illustrative thereof are the diols such as ethylene glycol, diethyl glycol, triethylene glycol, 1,2-propylene glycol, dipropylene glycol, 1,3-propylene glycol, polyethylene glycol, polypropylene glycol, neopentyl glycol, 1,4-butanediol, poly(oxyethylene-oxypropylene) glycols, and similar polyalkylene glycols, either blocked, capped or heteric, containing up to about 40 or more alkyleneoxy units in the molecule, 3-methyl-1-5-pentanediol, cyclohexanediol, 4,4'-methylene-bis-cyclohexanol, 4,4'-isopropylidene bis-cyclohexanol, xylenediol, 2-(4-hydroxymethylphenyl) ethanol, 1,4-butanediol, 1,6-hexanediol and the like; triols such as glycerol, trimethylolpropane, 1,2,6-hexanetriol, triethanolamine, triisopropanolamine, and the like; tetrols such as erythritol, pentaerythritol, N,N,N',N'-tetrakis(2-hydroxyethyl)ethylene diamine, and the like.

When the organic functional initiator is reacted with the caprolactone a reaction occurs that can be represented in its simplest form by the equation:

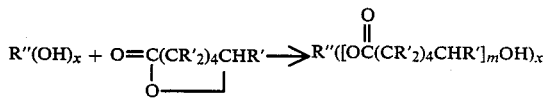

In this equation the organic functional initiator is the R''''—(OH)$_x$ compound and the caprolactone is the

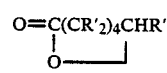

compound; this can be caprolactone itself or a substituted caprolactone wherein R' is an alkyl, alkoxy, aryl, cycloalkyl, alkaryl or aralkyl group having up to twelve carbon atoms and wherein at least six of the R' groups are hydrogen atoms, as shown in U.S. Pat. No. 3,169,945. The polycaprolactone polyols that are used are shown by the formula on the right hand side of the equation; they can have an average molecular weight of from 200 to about 6,000. The preferred polycaprolactone polyol compounds are those having an average molecular weight of from about 290 to about 6,000, most preferably from about 290 to 3,000. The most preferred are the polycaprolactone diol compounds having an average molecular weight of from about 290 to about 1,500 and the polycaprolactone triol and tetrol compounds having an average molecular weight of from about 290 to about 3,000; these are most preferred because of their low viscosity properties. In the formula m is an integer representing the average number of repeating units needed to produce the compound having said molecular weights. The hydroxyl number of the polycaprolactone polyol can be from about 15 to 600, preferably from 200 to 500; and the polycaprolactone can have an average of from 2 to 8, preferably 2 to 4, hydroxyl groups.

Illustrative of polycaprolactone polyols that can be used in the adhesive coating compositions of this invention, one can mention the reaction products of a polyhydroxyl compound having an average from 2 to 6 hydroxyl groups with caprolactone. The manner in which these type polycaprolactone polyols is produced is shown in U.S. Pat. No. 3,169,945 and many such compositions are commercially available. In the following table there are listed illustrative polycaprolactone polyols. The first column lists the organic functional initiator that is reacted with the caprolactone and the average molecular weight of the polycaprolactone polyol is shown in the second column. Knowing the molecular weights of the initiator and of the polycaprolactone polyol one can readily determine the average number of molecules of caprolactone (CPL Units) that reacted to produce the compounds; this figure is shown in the third column.

| POLYCAPROLACTONE POLYOLS | | |
|---|---|---|
| Initiator | Average MW of polyol | Average No. of CPL units in molecules |
| 1 Ethylene glycol | 290 | 2 |
| 2 Ethylene glycol | 803 | 6.5 |
| 3 Ethylene glycol | 2,114 | 18 |
| 4 Propylene glycol | 874 | 7 |
| 5 Octylene glycol | 602 | 4 |
| 6 Decalene glycol | 801 | 5.5 |
| 7 Diethylene glycol | 527 | 3.7 |
| 8 Diethylene glycol | 847 | 6.5 |
| 9 Diethylene glycol | 1,246 | 10 |
| 10 Diethylene glycol | 1,998 | 16.6 |
| 11 Diethylene glycol | 3,526 | 30 |
| 12 Triethylene glycol | 754 | 5.3 |
| 13 Polyethylene glycol (MW 200)* | 713 | 4.5 |
| 14 Polyethylene glycol (MW 600)* | 1,398 | 7 |
| 15 Polyethylene glycol (MW 1500)* | 2,868 | 12 |
| 16 1,2-Propylene glycol | 646 | 5 |
| 17 1,3-Propylene glycol | 988 | 8 |
| 18 Dipropylene glycol | 476 | 3 |
| 19 Polypropylene glycol (MW 425)* | 835 | 3.6 |
| 20 Polypropylene glycol (MW 1000)* | 1,684 | 6 |
| 21 Polypropylene glycol (MW 2000)* | 2,456 | 4 |
| 22 Hexylene glycol | 916 | 7 |
| 23 2-Ethyl-1,3-hexanediol | 602 | 4 |
| 24 1,5-Pentanediol | 446 | 3 |
| 25 1,4-Cyclohexanediol | 629 | 4.5 |
| 26 1,3-Bis(hydroxyethyl)-benzene | 736 | 5 |
| 27 Glycerol | 548 | 4 |
| 28 1,2,6-Hexanetriol | 476 | 3 |
| 29 Trimethylolpropane | 590 | 4 |
| 30 Trimethylolpropane | 750 | 5.4 |
| 31 Trimethylolpropane | 1,103 | 8.5 |
| 32 Triethanolamine | 890 | 6.5 |
| 33 Erythritol | 920 | 7 |
| 34 Pentaerythritol | 1,219 | 9.5 |
| 35 1,4-Butanediol | 546 | 4 |
| 36 Neopentyl Glycol | 674 | 5 |

*Average molecular weight of glycol.

The structures of the compounds in the above tabulation are obvious to one skilled in the art based on the information given. The structure of compound No. 7 is:

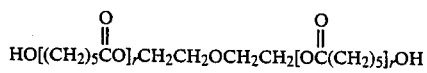

wherein the variable r is an integer, the sum of r+r has an average value of 3.7 and the average molecular weight is 527. The structure of compound No. 20 is:

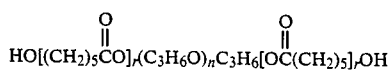

wherein the sum of r+r has an average value of 6 and the average molecular weight is 1,684. This explanation makes explicit the structural formulas of compounds 1 to 34 set forth above.

Polycaprolactone hexols suitable for use in the present invention can be prepared by the catalytic polymerization of an excess of polycaprolactone polyols and a cycloaliphatic epoxide. Illustrative polycaprolactone polyols useful in the preparation of polycaprolactone hexols include olycaprolactone diols, polycaprolactone triols and the like including mixtures thereof. Many of these polycaprolactone polyols are commercially available from Union Carbide Corporation. Cycloaliphatic epoxides suitable for use in preparing the polycaprolactone hexols include 3,4-epoxycyclohexylmethyl-3,4-epoxycyclohexane carboxylate, bis (3,4-epoxycyclohexylmethyl) adipate, vinyl cyclohexane dioxide and the like. Many of these cycloaliphatic epoxides are commercially available from Union Carbide Corporation. A suitable polymerization catalyst is diethylammonium triflate which is commercially available from the 3M Company as FC-520.

A preferred method for preparation of the polycaprolactone hexols comprises adding one or more polycaprolactone triols to a reactor, heating the polycaprolactone triols to a temperature of about 100° C. and adding the catalyst using a nitrogen sparge as soon as the polycaprolactone triols are molten. The polycaprolactone triols and catalyst mixture is then heated to a temperature of from about 150° C. to about 200° C. and a cycloaliphatic epoxide is added to the mixture. The reaction is carried out for about one hour to about three hours or until the oxirane content has been reduced to almost a nil value. A modification of this process can involve initially adding all of the ingredients into the reactor. A further modification of this method can involve a vacuum treatment of from 10 to 30 minutes after the catalyst addition and/or the use of a vacuum during the heating of the polycaprolactone triols to a molten state. Preferred polycaprolactone hexols suitable as ingredients in the coating compositions of this invention have an average molecular weight of from about 600 to about 1500.

Although not specifically mentioned above, it is appreciated that other lactone based polyols can be used in the coating compositions of this invention. Illustrative of other lactone based polyols include those derived from beta-propiolactone, delta-valerolactone, zeta-enantholactone and the like including derivatives thereof such as gamma-methyl-delta-valerolactone and the like.

The polymer/polyols that can be used to prepare the adhesive coating compositions of this invention are known materials. Such polymer/polyols can be produced by polymerizing one or more ethylenically unsaturated monomers dissolved or dispersed in a base polyol in the presence of a free radical catalyst. The production of polymer/polyols is more fully described in U.S. Pat. No. Re. 28,715, U.S. Pat. No. Re. 29,118, U.S. Pat. No. 3,652,639, U.S. Pat. Re. 29,014, U.S. Pat. No. 3,950,317, U.S. Pat. No. 4,208,314, U.S. Pat. No. 4,104,236, U.S. Pat. No. 4,172,825 and U.S. Pat. No. 4,198,488.

While poly(oxypropylene) polyols are preferred, substantially any of the polyols previously used in the art to make polymer/polyols can be used as the base polyol. Illustrative of the base polyols useful in producing polymer/polyol compositions are the polyether polyols such as polyhydroxyalkanes and polyoxyalkylene polyols, or the like. Among the base polyols which can be employed are those selected from one or more of the following classes of compositions, alone or in admixture, known to those skilled in the art and described more fully hereinabove:

(a) Alkylene oxide adducts of polyhydroxyalkanes;
(b) Alkylene oxide adducts of non-reducing sugars and sugar derivatives;
(c) Alkylene oxide adducts of phosphorus and polyphosphorus acids;
(d) Alkylene oxide adducts thereof of polyphenols;
(e) The polyols from natural oils such as castor oil, and the like.

The most preferred base polyols employed in the polymer/polyols which are useful as ingredients in the adhesive coating compositions of this invention include the poly(oxypropylene) polyols. It should be appreciated that a blend or mixture of more than one base polyol can be utilized, if desired, to form the polymer/polyol.

Conceptually, the monomers used in preparing the polymer/polyols can comprise any ethylenically unsaturated monomer or monomers. A variety of monomers are disclosed in the patents relating to polymer/polyols previously referred to. The selection of the monomer or monomers used will depend on considerations such as the relative cost of the monomers and the product characteristics required for the intended application.

The preferred monomer and monomer mixture used to make the polymer portion of the polymer/polyols is acrylonitrile and a mixture of acrylonitrile and styrene respectively. The relative weight proportions of acrylonitrile to styrene can range from about 80:20 to about 20:80. It may be desirable in some applications to utilize, with acrylonitrile, a comonomer other than styrene. Representative examples of suitable comonomers include methyl methacrylate, vinyl chloride and vinylidene chloride.

The polymer and polyol content of the polymer/polyols can vary within wide limits, depending upon the requirements of the anticipated end use application. In general, the polymer content will vary from about 10 to about 50 percent, based upon the wight of the polymer/polyol. The polyol content of the polymer/polyols varies from about 50 to about 90 percent, based upon the weight of the polymer/polyol.

The polymer/polyols may, if desired, be blended with other conventional polyols described hereinabove to reduce the polymer content to the level desirable for the particular end use application. Blends in which the resulting polymer content is as low as 4 percent of the total weight of the blend or even less may be useful in the adhesive coating compositions of this invention.

The most preferred classes of polyols employed in the adhesive coating compositions of this invention are the polycaprolactone polyols such as TONE-0200 and TONE-0305 commercially available from Union Carbide Corporation, the dihydroxyl functional polytetramethylene oxide polyols such as Polymeg 650, 1000 and 2000 commercially available from Quaker Oats Company, the polymer/polyols such as NIAX Polymer Polyol 31-23 and 34-28 commercially available from Union Carbide Corporation, and of course the ethylene oxide and propylene oxide adducts including ethylene glycol, diethylene glycol, the poly(oxyethylene) glycols, the poly(oxypropylene) glycols, triols and higher functionality polyols such as LHT-67, LHT-112, and LG-56 commercially available from Union Carbide Corporation. A preferred alkylene oxide derived polyol suitable for use in the coating compositions of this invention has the following formula:

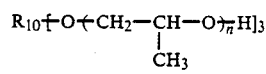

wherein $R_{10}$ is alkane of 3 to 10 carbon atoms, preferably 3 carbon atoms, and n is an integer of from about 10 to about 25. These polyols also include poly(oxypropylene-oxyethylene) polyols; however, desirably, the oxyethylene content should comprise less than 80 percent of the total and preferably less than 60 percent. The ethylene oxide when used can be incorporated in any fashion along the polymer chain. Stated another way, the ethylene oxide can be incorporated either in internal blocks, as terminal blocks, such as the propylene oxide polyols capped with ethylene oxide, i.e., NIAX Polyol 11-27 and 11-34 and E-474, commercially available from Union Carbide Corporation, or may be randomly distributed along the polymer chain. As is well known in the art, the polyols that are most preferred herein contain varying small amounts of unsaturation. Unsaturation in itself does not affect in any adverse way the formation of the coating composition in accordance with the present invention.

Other preferred representative examples of organic polyols that may be employed in the coating compositions of this invention include copolymers of hydroxypropyl and hydroxyethyl acrylates and methacrylates with other free radical-polymerizable monomers such as acrylate esters, vinyl halides, vinyl acetate or styrene; copolymers containing pendent hydroxy groups formed by hydrolysis or partial hydrolysis of vinyl acetate copolymers, polyvinylacetal resins containing pendent hydroxyl groups; modified cellulose polymers such as hydroxyethylated and hydroxypropylated cellulose; hydroxy terminated polyesters and hydroxy terminated polyalkadienes. The polyester polyols are the reaction products of polyfunctional organic carboxylic acids and polyhydric alcohols and include, for example, poly(hexamethylene adipate), poly(ethylene adipate), poly(butylene adipate) and the like. Many of these organic polyols can be prepared by conventional methods and are commercially available from a number of manufacturers such as polyvinylacetal resins commercially available from Monsanto Chemical Company as Butvar B-72A, B-73, B-76, B-90 and B-98 and as Formvar 7/70, 12/85, 7/95S, 7/95E, 15/95S and 15/95E; an aliphatic polyester diol commercially available from Rohm and Haas as Paraplex U-148; saturated polyester polyols commercially available from Mobay Chemical Company as Multron R-2, R-12A, R-16, R-18, R-38, R-68, and R-74; a hydroxypropylated cellulose having an equivalent weight of approximately 100 commerically available from Hercules, Inc. as Klucel E; and a cellulose acetate butyrate ester having a hydroxyl equivalent weight of approximately 400 commercially available from Eastman Kodak as Alcohol Soluble Butyrate.

The poly(active hydrogen) organic compounds utilized in the adhesive coating compositions of this invention can be mixtures or blends of organic polyols. For example, when utilizing a polycaprolactone polyol, it may be desirable to mix or blend one or more of a propylene oxide polyol, a propylene oxide polyol capped with ethylene oxide, a polytetramethylene oxide polyol or a polymer/polyol therewith. Other mixtures or blends may similarly be used if desired. The concentration of the organic polyols in the photocopolymerizable and blend compositions of this invention can range from about 1 to about 60 weight percent, preferably from 5 to 40 weight percent, and most preferably from 10 to 30 weight percent of the total weight of the coating composition.

The photoiniator suitable for use in the adhesive coating compositions of this invention may be any one of the well known photoinitiators such as described in, for example, U.S. Pat. Nos. 4,231,951; 4,256,828; 4,138,255 and 4,058,401, which patents are incorporated herein by reference. Preferred photoinitiators alone or in admixture include triarylsulfonium complex salts as described in U.S. Pat. Nos. 4,231,951, aromatic sulfonium or iodonium salts of halogen-containing complex ions as described in U.S. Pat. No. 4,256,828; aromatic onium salts of Group VIa elements as described in U.S. Pat. Nos. 4,058,401 and 4,138,255; aromatic onium salts of Group Va elements as described in U.S. Pat. No. 4,069,055. Such salts are commercially available as FC-508 and FC-509 (available from Minnesota Mining and Manufacturing Company), and as UVE-104 (available from General Electric Company). Other preferred photoinitiators for use in the coating compositions of this invention are described more fully in copending U.S. patent application Ser. No. 464,570, filed on an even date herewith. The photoinitiators are used in conventional amounts such as from about 0.1 to 30 parts by weight per 100 parts by weight of the combination of vinyl cycloaliphatic monoepoxide and the poly(active hydrogen) organic compound.

The adhesive coating compositions may preferably include additives in conventional quantities such as oils, particularly silicone oil, surfactants such as silicone-alkylene oxide copolymers, e.g., L-5410 commercially available from Union Carbide Corporation, silicone oil containing aliphatic epoxide groups, fluorocarbon surfactants such as FC-171 commercially available from the 3M Company and FC-430 also commercially available from the 3M Company; low molecular weight alcohols such as RJ-100 commercially available from Monsanto Chemical Company; cellosolves, such as butyl CELLOSOLVE commercially available from Union Carbide Corporation; carbitols, such as butyl CARBITOL; diethyleneglycol; low molecular weight hydroxy-containing vinyl polymers such as UCAR Solution Vinyl VYES commercially available from Union Carbide Corporation; glycidyl ether monomers of the formula:

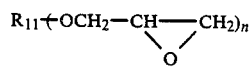

wherein $R_{11}$ is alkyl or aryl and n is an integer of 1 to 6. Examples are glycidyl ethers of polyhydric phenols obtained by reacting a polyhydric phenol with an excess of chlorohydrin such as epichlorohydrin. Further examples of this type are described in, for example, U.S. Pat. No. 3,018,262; alpha olefin epoxides; epoxy novolaks, and the like. If desired, one may also include in the adhesive coating compositions various conventional non-basic fillers (e.g., silica, talc, glass beads or bubbles, clays, powdered metal such as aluminum, zinc oxide, etc.) up to about 50% by volume or more, viscosity modifiers, rubbers, tackifying agents, pigments, and so forth. The particular additives or fillers selected are of no consequence to the basic invention.

The photocopolymerizable coating compositions of this invention may optionally include an epoxide containing two or more epoxy groups. The use of epoxides containing two or more epoxy groups in photocopolymerizable compositions based on epoxy and hydroxyl containing organic materials is more fully described in copending U.S. patent application Ser. No. 464,571, filed on an even date herewith.

In preparing the coating compositions, the ingredients are mixed by conventional procedures used in the production of inks, paints and coating compositions. These procedures are so well known to those skilled in the art that they do not require further discussion here. However, it should be noted that when the photoinitiator is incorporated into the coating compositions, it is necessary that the curable coating formulation be mixed or blended under "safe light" such as a yellow light source to obviate or minimize photocopolymerization. The coating compositions can also contain an organic solvent as an optional component. Any of the conventional solvents used in the coatings industry can be used at a concentration preferably below 30 weight percent of the total weight of the coating composition. Suitable solvents are acetone, methylene chloride and any solvent that does not react appreciably with the substituted cycloaliphatic monoepoxide, the epoxide containing two or more epoxy groups and the photoinitiator. While larger amounts of solvent could conceivably be used, the use of larger amounts would negate the benefits of radiation curable coating which are considered to be essentially 100 percent solids coating systems. The solvents are generally added in the small amounts indicated to improve flowability during application of the coating composition to the substrate.

The curable coating compositions of this invention are applied to a suitable surface or substrate by conventional means such as roll coating or spray. Curing or photocopolymerization of the coating compositions occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials and photoinitiators being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more. Generally speaking the rate of polymerization increases with increasing amounts of photoinitiator at a given light exposure or irradiation. The rate of polymerization also increases with increases light intensity or electron dosage.

The curing or photocopolymerization of the coating compositions is a triggered reaction. Once the degradation of the photoinitiator to a cationic catalyst has begun by exposure to a radiation source, the curing or photocopolymerization reaction proceeds and will continue after the radiation source is removed. The use of thermal energy during or after exposure to a radiation source, i.e., post cure thermally, will generally accelerate the curing reaction, and even a moderate increase in temperature may greatly accelerate cure rate.

The coating compositions were evaluated according to the following procedures:

Solvent Resistance (Double Acetone Rubs): a measure of the resistance of the cured film to attack by acetone in which a film coating surface was rubbed with an acetone soaked cheesecloth back and forth with hand pressure. A rub back and forth with hand pressure over the film coating surface with the acetone soaked cheesecloth was designated as one "double acetone rub". The effect that a certain number of double acetone rubs had on the film coating surface was reported by a number in parenthesis following the number of double acetone rubs. The rating system for evaluating acetone resistance for a given number of double acetone rubs was as follows:

Number in Parenthesis After Number of Rubs (1) No change in coating appearance.
(2) Scratched surface.
(3) Dulled, marred, some coating removed.
(4) Breaks in coating appearance.
(5) About one-half of the coating removed.

Pencil Hardness: pencil leads of increasing hardness values were forced against the film coating surface in a precisely defined manner as described in ASTM-D-3363-74 until one pencil lead marred the surface of the film coating. The surface hardnes was considered as the hardest pencil grade which just failed to mar the film coating surface. The pencil leads in order of softest to hardest were reported as follows: 6B, 5B, 4B, 3B, 2B, B, HB, F, H, 2H, 3H, 4H, 5H, 6H, 7H, 8H, and 9H.

Crosshatch Adhesion: a lattice pattern with ten cuts in each direction was made in the coating film to the substrate and pressure-sensitive adhesive tape was applied over the lattice pattern and then removed. The adhesion was evaluated by comparison with descriptions and illustrations as more fully detailed in ASTM D 3359-78.

Forward Impact Resistance (Gardner Impact): a measure of the ability of a cured film coating to resist rupture from a falling weight. A Gardner Impact Tester Model IG-1120 using an eight pound dart was used to test film coatings cast and cured on steel panels. The dart was raised to a given height in inches and dropped onto the coated side of the coated steel panel. The inches times pounds, designated inch-pounds, absorbed by the film without rupturing was recorded as the films forward impact resistance.

Reverse Impact Resistance (Gardner Impact): a measure of the ability of a cured film coating to resist rupture from a falling weight. A Gardner Impact Test Model IG-1120 using an eight pound dart was used to test film coatings cast and cured on steel panels. The dart was raised to a given height in inches and dropped onto the uncoated side of the coated steel panel. The inches times pounds, designated inch-pounds, absorbed by the film without rupturing was recorded as the films reverse impact resistance.

Peel Adhesion: a measure of the force required to remove a pressure sensitive tape from a panel or its own backing at a specified angle and speed. The tape is applied to a standard test panel, or a test panel covered with the tape under test, using definite pressure to make the contact. The force is expressed in ounces (converted to pounds) per inch width of tape (PLI). This method designated as PSTC-1 is described more fully in Test Methods for Pressure Sensitive Tapes, Seventh Edition, p. 22, Developed by the Specifications and Technical Committee of the Pressure Sensitive Tape Council, Glenview, Ill. (1976).

Shear Adhesion: a measure of the force required to pull the pressure sensitive tape from a standard flat surface in a direction parallel to the surface to which it has been affixed with a definite pressure. It can be measured in terms of the time required to pull a standard area of tape from a test panel under a standard load, or in terms of a distance the tape has been displaced in a given time on a test panel under a standard load. This method designated as PSTC-7 is described more fully in Test Methods for Pressure Sensitive Tapes, Seventh Edition, p. 30, Developed by the Specifications and Technical Committee of the Pressure Sensitive Tape Council, Glenview, Ill. (1976).

The following examples are illustrative of the present invention and are not intended as a limitation upon the scope thereof. As used in the examples appearing hereinafter, the following designations, terms and abbreviations have the indicated meanings:

| | |
|---|---|
| cps | centipoise |
| in/lbs. | inch/pounds |
| °C. | Centigrade degree |
| PLI | pounds per linear inch |
| gm | grams |
| Numbered Examples | examples which illustrate this invention. |
| Lettered Examples | comparative examples which do not illustrate this invention. |
| Polyol I | A polycaprolactone diol having an average molecular weight of 530, an average hydroxyl number of 212 and commercially available from Union Carbide Corporation as TONE-0200. |
| Polyol II | A polycaprolactone triol having an average molecular weight of 540, an average hydroxyl number of 310 and commercially available from Union Carbide Corporation as TONE-0305. |
| Polyol III | A polycaprolactone hexol prepared by adding 450 grams of Polyol VIII, 540 grams of Polyol II, 274 grams of 3,4-epoxycyclohexylmethyl-3,4-epoxycyclohexane carboxylate commercially available from Union Carbide Corporation and 3.8 grams of diethylammonium triflate catalyst commercially available from 3M Company to a reaction flask and heating to 150° C. under a nitrogen blanket for 1.5 hours. The resulting polycaprolactone hexol product had an average molecular weight of 900 and a hydorxyl number of 325. |
| Polyol IV | A propylene oxide polyol having an average equivalent weight of 501, an average hydroxyl number of 112 and commercially available from Union Carbide Corporation as LHT-112. |
| Polyol V | A propylene oxide polyol having an average equivalent weight of 974, an average hydroxyl number of 58 and commercially available from Union Carbide Corporation as LG-56. |
| Polyol VI | A propylene oxide polyol capped with ethylene oxide having an average equivalent weight of 2004, an average hydroxyl number of 28 and commercially available from Union Carbide Corporation as E-474. |

| | -continued |
|---|---|
| Polyol VII | A propylene oxide polyol capped with ethylene oxide having an average equivalent weight of 2078, an average hydroxyl number of 27 and commercially available from Union Carbide Corporation as NIAX Polyol 11-27. |
| Polyol VIII | A polycaprolactone triol having an average molecular weight of 300, an average hydroxyl number of 560 and commercially available from Union Carbide Corporation as TONE-0301. |
| Polymer/Polyol I | A polymer/polyol based on a propylene oxide polyol that contains 10 percent polyacrylonitrile in a dispersed solid phase; having an average equivalent weight of 2440, an average hydroxyl number of 23 and commercially available from Union Carbide Corporation as NIAX Polymer Polyol 31-23. |
| Photoinitiator I | A solution of a triarylsulfonium hexafluoroantimony salt having a specific gravity of 1.39, a Brookfield viscosity of 74 centipoise at 25° C. and commercially available from General Electric Company as UVE-1014. |
| Reactive Diluent I | 4-Vinyl cyclohexene monoepoxide. |
| Surfactant I | A silicone composition having the following structure |

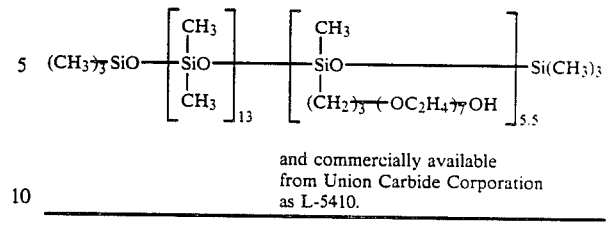

and commercially available from Union Carbide Corporation as L-5410.

Examples 1 through 26 and Comparative Examples A through f

Into brown glass bottles under a yellow light source was added Polyol I, Polyol II, Polyol III, Polyol IV, Polyol V, Polyol VI, Polyol VII, Polymer/Polyol I, Photoinitiator I, Surfactant I and Reactive Diluent I in the amounts specified for each example and comparative example in Table I below. The contents in the bottles were thoroughly blended until homogeneous by simple stirring at ambient temperature. The viscosity of the resulting blends prepared in each example and comparative example was then determined with a Brookfield viscometer at 25° C. (centipoise). The viscosity results are given in Table I.

TABLE I

| Example | A | B | C | D | E | F | 1 | 2 | 3 |
|---|---|---|---|---|---|---|---|---|---|
| Ingredients, grams | | | | | | | | | |
| Polyol I | 0 | 0 | 0 | 100.0 | 0 | 0 | 0 | 0 | 0 |
| Polyol II | 0 | 0 | 0 | 0 | 0 | 0 | 0 | 0 | 0 |
| Polyol III | 0 | 0 | 0 | 0 | 0 | 0 | 0 | 0 | 0 |
| Polyol IV | 0 | 0 | 0 | 0 | 0 | 100.0 | 0 | 0 | 0 |
| Polyol V | 0 | 0 | 0 | 0 | 100.0 | 0 | 0 | 0 | 0 |
| Polyol VI | 100.0 | 0 | 0 | 0 | 0 | 0 | 10.0 | 25.0 | 0 |
| Polyol VII | 0 | 0 | 100.0 | 0 | 0 | 0 | 0 | 0 | 0 |
| Polymer/Polyol I | 0 | 100.0 | 0 | 0 | 0 | 0 | 0 | 0 | 10.0 |
| Photoinitiator I | 0 | 0 | 0 | 0 | 0 | 0 | 4.0 | 4.0 | 4.0 |
| Reactive Diluent I | 0 | 0 | 0 | 0 | 0 | 0 | 90.0 | 75.0 | 90.0 |
| Surfactant I | 0 | 0 | 0 | 0 | 0 | 0 | 0.5 | 0.5 | 0.5 |
| Properties | | | | | | | | | |
| Viscosity, centipoise | 1,330 | 3,500 | 1,200 | SOLID | 490 | 310 | 16 | 20 | 16 |

| Example | 4 | 5 | 6 | 7 | 8 | 9 | 10 | 11 | 12 | 13 |
|---|---|---|---|---|---|---|---|---|---|---|
| Ingredients, grams | | | | | | | | | | |
| Polyol I | 0 | 0 | 10.0 | 20.0 | 0 | 0 | 0 | 0 | 0 | 0 |
| Polyol II | 0 | 0 | 0 | 0 | 0 | 0 | 0 | 0 | 20.28 | 0 |
| Polyol III | 0 | 0 | 0 | 0 | 0 | 0 | 0 | 0 | 0 | 29.22 |
| Polyol IV | 0 | 0 | 0 | 0 | 0 | 0 | 10.0 | 25.0 | 0 | 0 |
| Polyol V | 0 | 0 | 0 | 0 | 10.0 | 25.0 | 0 | 0 | 0 | 0 |
| Polyol VI | 0 | 0 | 0 | 0 | 0 | 0 | 0 | 0 | 0 | 0 |
| Polyol VII | 0 | 10.0 | 0 | 0 | 0 | 0 | 0 | 0 | 0 | 0 |
| Polymer/Polyol I | 25.0 | 0 | 0 | 0 | 0 | 0 | 0 | 0 | 0 | 0 |
| Photoinitiator I | 4.0 | 4.0 | 4.0 | 4.0 | 4.0 | 4.0 | 4.0 | 4.0 | 4.0 | 4.0 |
| Reactive Diluent I | 75.0 | 90.0 | 90.0 | 80.0 | 90.0 | 75.0 | 90.0 | 75.0 | 75.27 | 66.28 |
| Surfactant I | 0.5 | 0.5 | 0.5 | 0.5 | 0.5 | 0.5 | 0.5 | 0.5 | 0.5 | 0.5 |
| Properties | | | | | | | | | | |
| Viscosity, centipoise | 28 | 10 | 10 | 12 | 10 | 14 | 10 | 12 | 10 | 22 |

Table I shows that the viscosities of the blend formulations containing Reactive Diluent I, i.e., Examples 1 through 13, are significantly lower than the viscosities of Comparative Examples A through F which do not contain Reactive Diluent I.

The blended formulations of Examples 1 through 13 were then applied to Bonderite 37 ® treated steel panels using a Number 20 wire-wound rod and cured with one pass under a 100 watt per inch, medium pressure, mercury lamp ultraviolet light source at 30 feet per minute. The cured coating on the Bonderite 37® treated steel panels of Examples 14 through 18 was prepared from the blended formulations of Examples 1 through 5 respectively. The cured coating on the Bonderite 37® treated steel panels of Examples 25 and 26 was prepared from the blended formulations of Examples 12 and 13 respectively. The thickness of the coatings varied from about 0.8 mils to about 0.9 mils. The cured coatings in Table II below were not post cured thermally before testing for the properties designated in Table II. The results of the testing are given in Table II.

TABLE II

| Properties | Example | | | | | |
|---|---|---|---|---|---|---|
| | 14 | 15 | 16 | 17 | 18 | 19 |
| Double Acetone Rubs | 2(5) | 2(5) | 2(5) | 2(5) | 2(5) | 2(5) |
| Pencil Hardness | <5B | * | <5B | * | <5B | <5B |
| % Crosshatch Adhesion | 100 | * | 100 | * | 100 | 100 |
| Gardner Impact, in. lbs. | | | | | | |
| Forward | 15 | * | 15 | * | 15 | 15 |
| Reverse | <5 | * | <5 | * | <5 | <5 |

| Properties | Example | | | | |
|---|---|---|---|---|---|
| | 20 | 21 | 22 | 23 | 24 |
| Double Acetone Rubs | 2(5) | 2(5) | 2(5) | 2(5) | 2(5) |
| Pencil Hardness | * | <5B | * | <5B | * |
| % Crosshatch Adhesion | * | 100 | * | 100 | * |
| Gardner Impact, in. lbs. | | | | | |
| Forward | * | 15 | * | 15 | * |
| Reverse | * | <5 | * | <5 | * |

| Properties | Example | |
|---|---|---|
| | 25 | 26 |
| Peel Adhesion, PLI | 1.0–4.4 | 1.0–4.4 |
| Shear Adhesion, hours | <0.1 | <0.1 |

*The cured coatings were too soft to measure and were adhesive-like in character.

Table II shows that the cured coatings prepared from the blend formulations of Examples 1 through 13 were soft and adhesive-like in character. The cured coatings on the Bonderite 37® treated steel panels of Examples 14 through 26 had a slight tack when warm immediately after ultraviolet light irradiation. When cooled to room temperature, the cured coatings on the Bonderite 37® treated steel panels of Examples 14, 16, 18, 19, 21 and 23 were tack free and were therefore, suitable for use as coatings and/or heat-activated adhesives. When cooled to room temperature, the cured coatings on the Bonderite 37® treated steel panels of Examples 15, 17, 20, 22, 24, 25 and 26 maintained a tack and were therefore suitable for use as pressure sensitive adhesives.

Additional cured coatings on Bonderite 37® treated steel panels were prepared as described above from the blend formulations of Examples 12 and 13 and tested for adhesive strength. About an inch of the coated panels were contacted over their width and pressed together with thumb and forefinger pressure. The contacted panels exhibited excellent lap shear and peel strength as determined by separation of the contacted panels by hand force. In one instance, the coated Bonderite 37® treated steel panel actually bent before the contacted bond failed in peel adhesion.

The blended formulation of Example 13 was also applied to a polypropylene film commercially available from Hercules, Inc. as Pellicules Film Type T-502 using a Number 20 wire-wound rod and cured with one pass under a 100 watt per inch, medium pressure, mercury lamp ultraviolet light source at 30 feet per minute. The thickness of the coating was about 0.9 mils. The blend formulation wet the surface of the polypropylene film very well and cured into a smooth adhesive coating. The resulting coating exhibited excellent adhesive characteristics as determined by pressure contact of the coated polypropylene film with a surface and separation thereof by hand force.

We claim:

1. A photocopolymerizable composition which, when cured is suitable for use as a pressure sensitive adhesive, comprising at least about twenty percent by weight of a polycaprolactone polyol, a cycloaliphatic monoepoxide having a vinyl substituent and a photoinitiator.

2. A photocopolymerizable composition as defined in claim 1 wherein the polycaprolactone polyol is a polycaprolactone diol.

3. A photocopolymerizable composition as defined in claim 1 wherein the polycaprolactone polyol is a polycaprolactone triol.

4. A photocopolymerizable composition as defined in claim 1 wherein the polycaprolactone polyol is a polycaprolactone hexol.

5. A photocopolymerizable composition as defined in claim 1 wherein the polycaprolactone polyol is present in said composition in an amount of about 20 to about 30 percent by weight.

6. A photocopolymerizable composition as defined in claim 1 wherein the cycloaliphatic monoepoxide is 4-vinylcyclohexene monoepoxide.

7. A photocopolymerizable composition as defined in claim 1 wherein the photoinitiator is a triarylsulfonium hexafluoro antimony salt.

8. A photocopolymerizable composition as defined in claim 1 wherein the photoinitiator is a triarylsulfonium hexafluoro antimony salt and the cycloaliphatic monoepoxide is 4-vinylcyclohexene monoepoxide.

9. The cured product of the composition defined in claim 1.

* * * * *